United States Patent [19]

Gerlach et al.

[11] 4,109,210
[45] Aug. 22, 1978

[54] METHOD OF GENERATING A VARIABLE TRAIN OF PULSES

[75] Inventors: Albrecht Gerlach, Freiamt; Dieter Holzmann, Freiburg, both of Germany; Daniel Mlynek, Wolfgantzen, France; Dirk Hoffmeister, Mahlberg, Germany

[73] Assignee: ITT Industries, Incorporated, New York, N.Y.

[21] Appl. No.: 766,991

[22] Filed: Feb. 9, 1977

[30] Foreign Application Priority Data

Feb. 28, 1976 [DE] Fed. Rep. of Germany ....... 2608268

[51] Int. Cl.² .............................................. H03K 3/64
[52] U.S. Cl. ...................................... 328/61; 328/48; 328/129; 328/58

[58] Field of Search .................. 328/60, 61, 129, 104, 328/14, 26, 15, 119, 58, 48

[56] References Cited

U.S. PATENT DOCUMENTS

| 3,624,517 | 11/1971 | Kubayashi et al. | 328/61 |
| 3,660,767 | 5/1972 | Yoshino et al. | 328/15 |
| 3,805,167 | 4/1974 | Nash et al. | 328/61 |
| 3,891,929 | 6/1975 | Carr et al. | 328/14 |

*Primary Examiner*—John S. Heyman
*Attorney, Agent, or Firm*—John T. O'Halloran; Peter C. Van Der Sluys

[57] ABSTRACT

The invention discloses a method and apparatus for digitally generating a variable pulse train with some pulses in a period T, the number of which can be changed step by step. The pulse train can be used for generating a variable dc voltage particularly for the tuning voltage of TV receiver capacitance diodes.

4 Claims, 5 Drawing Figures

METHOD OF GENERATING A VARIABLE TRAIN OF PULSES

BACKGROUND OF THE INVENTION

This invention relates to a method and apparatus for generating a train of pulses variable in N selectable increments during a period T. Such pulse trains can be used to generate a dc voltage if they are averaged in time by means of a filtering element. If, of the maximum possible number N of increments during the period T, $n$ ($n = 0, 1, 2 \ldots N$) increments are generated, and the number $n$ is varied, a continuously variable dc voltage can be taken from the output of the filtering element.

As is generally known, dc voltages derived from pulse voltages by means of filtering elements have a hum voltage superimposed thereon whose amplitude is dependent on the design of the filtering element. If an extremely low hum voltage is required in certain applications, a considerable amount of filtering circuitry is needed.

If, for example, the pulse train variable in N increments were generated during the period T by successively increasing the duration of a rectangular pulse in $n$ increments, i.e. by generating a rectangular pulse with a mark-to-space ratio variable as a function of $n$, a very high hum voltage would be obtained at a unity mark-to-space ratio; this hum voltage would necessitate expensive filtering elements.

If, on the other hand, the pulse train were generated as invividual pulses distributed over the period T, the pulse train obtained would have a very low hum voltage after filtering, but the large number of leading and trailing pulse edges would be disadvantageous. These pulse edges cause the components generating them, particularly semiconductor devices, to be turned on and off, so the dissipation of these components is variable as a function of the number $n$. This temperature dependence also appears in the filtered dc voltage.

SUMMARY OF THE INVENTION

The object of the invention is, therefore, to avoid the above-mentioned disadvantages of the known methods of generating a variable pulse train in such a way that the continuously variable dc voltage generated by means of the filtering element is largely independent of temperature, and that the filtering element can be simple in design. According to a broad aspect of the invention, there is provided a method of generating a train of pulses which is variable in N selectable increments during a period T, which period is divided into two subperiods T1 and T2, said train of pulses applied to the input of a filtering element to generate a continuously variable dc voltage, comprising: allotting $n$ ($n = 0, 1, 2 \ldots N$) increments $n$ pulses whose duration B is equal to the period T divided by the number N of increments; generating $m$ pulses of the $n$ pulses where $m = 0, 1, 2 \ldots M$; ($M < N$) in one sub-period T1 of the period T and the remainder of the $n$ pulses in the other sub-period T2 of the period T such that for $n \leq M$, $m$ pulses are lined up in the sub-period T1 with no space therebetween and for $M < n \leq N$, $k$ bursts ($k = 1, 2 \ldots K$; $K = (N-M)/M$) of M unspaced pulses of the duration B are formed from the $n$ pulses, which bursts are distributed substantially evenly over the sub-period T2 and, for $k > K/2$, follow each other at least partly with no space therebetween, those pulses not forming a full burst are generated as $m$ unspaced pulses in the sub-period T1.

The above and other objects of the present invention will be more clearly understood from the following detailed description taken in conjunction with the accompanying drawings in which:

DESCRIPTION OF THE PREFERRED EMBODIMENT

Figure 1:
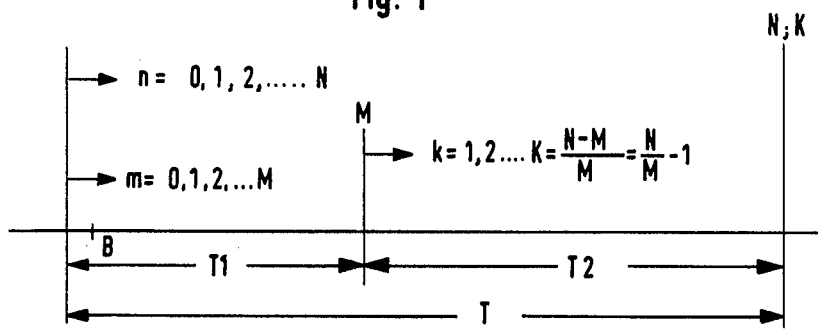
FIG. 1 shows the division of the period T into subperiods T1, T2, and definitions chosen for a better understanding of the invention.

The period T shown in FIG. 1 is divided into subperiods T1, T2. The number N of possible increments and the period T determine the duration B of the pulses forming the pulse train to be generated. According to the invention, a pulse having a duration of $B = T/N$ belongs to each increment. The number N of increments can be arbitrarily chosen, but will mostly be a fixed number in practice. Starting from 0, these N increments are then performed according to the consecutive number $n$:

$$n = 0, 1, 2 \ldots N \text{ or } 0 \leq n \leq N.$$

Of the $n$ possible pulses, M fall within the sub-period T1, with this number M being freely selectable, too, but always being smaller than N. Advantageously, the number M will be chosen to be about one order of magnitude smaller than the possible number N of increments. The duration B of the pulses, the period T1, the number M, and the number N of increments are interrelated as follows:

$$T1 = B \cdot M = TM/N.$$

To permit a better distinction, the $n$ pulses falling within the sub-period T1 are designated $m$, for which the following relationship holds, as shown in FIG. 1:

$$m = 0, 1, 2 \ldots M \text{ or } 0 \leq m \leq M.$$

According to the method of the invention, the N - M pulses falling within the sub-period T2 are combined into K bursts each of which consists of M pulses of the duration B. For K, therefore, the following relationship holds:

$$K = (N - M)/M.$$

The consecutive number $k$ gives the number of bursts belonging to a given value of $n$; accordingly, $$k = 1, 2 \ldots K \text{ or } 1 \leq k \leq K.$$

From the above relationship for the duration of the subperiod T1, it follows that $$T2 = T(N - M)/N.$$

Figure 2:
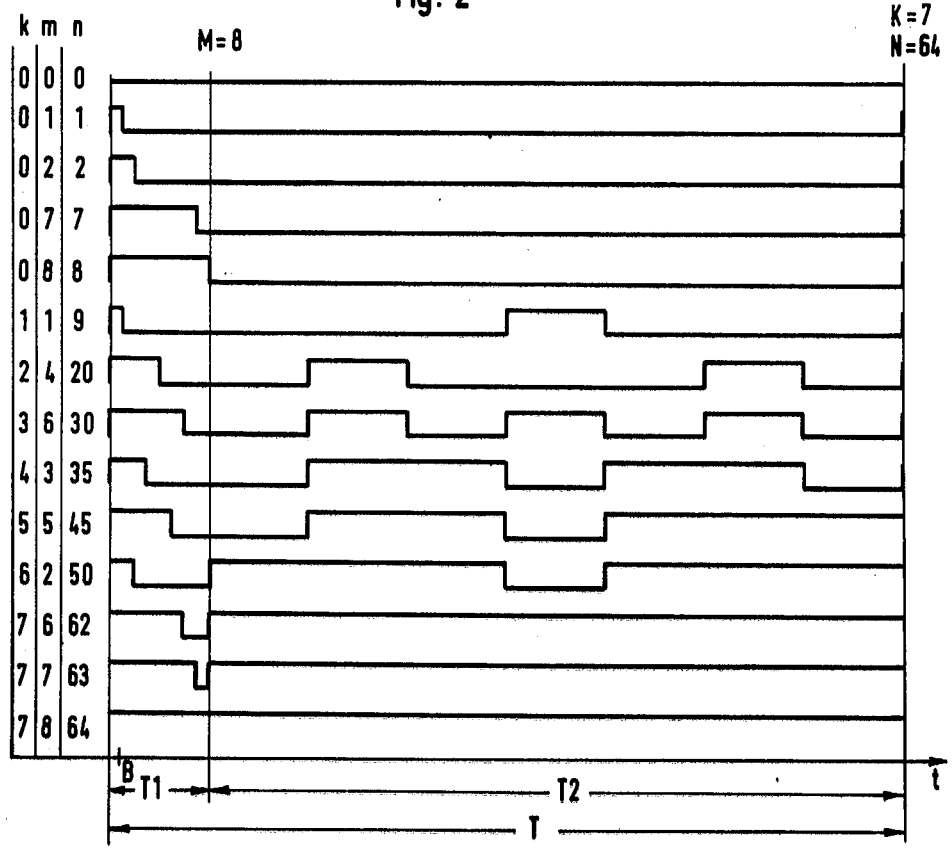
FIG. 2 shows various pulse trains for numerical examples of the variables of FIG. 1.

To illustrate the method of invention, FIG. 2 shows a few characteristic pulse trains for assumed values ($N = 64$; $M = 8$; $K = 7$). The third column at the left-hand margin of FIG. 2 shows the consecutive number $n$ belonging to the respective pulse train; the two other columns show the associated consecutive numbers k and m.

Starting from 0, eight pulses are first lined up with no space therebetween, as is shown for the pulse trains n = 0, 1, 2, 7 and 8. For the pulse train 9, which thus consists of nine pulses of the duration B, eight pulses are generated in the middle of the sub-period T2 as a burst consisting of eight unspaced pulses of the duration B, while the ninth pulses, as in the pulse train 1, is generated as the first pulse in the sub-period T1. For n = 10 . . . 16, the corresponding pulses are then lined up in the sub-period T1 with no space therebetween, as in the pulse trains 2 to 8. At n = 17 two bursts are generated in the sub-period T2. According to the invention, this is done in such a way that the bursts are again distributed as evenly as possible over the sub-period T2. In FIG. 2, therefore, the pulse train 20, which contains four unspaced pulses in the sub-period T1, is shaped so that the two bursts are generated in the second and the sixth of the seven possible positions. At the transition from n = 24 to n = 25, a third burst is generated in the sub-period T2; this burst is again generated in the position of the burst belonging to the pulse trains 9 to 16. To illustrate this, FIG. 2 shows the pulse train 30 with six pulses in the sub-period T1.

At the transition from n = 32 to n = 33, a fourth burst is generated in the sub-period T1 as shown in the pulse train 35: The four bursts are generated in the positions 3, 4 and 5, 6, while no burst is generated in the fourth position, so two pairs of bursts follow each other with no space between the respective pairs.

At the transition from n = 40 to n = 41, a fifth burst is generated in the sub-period T2 in the seventh position, so there are no spaces between the bursts of the second and third positions and between the bursts of the fifth, sixth and seventh positions, cf. the pulse train 45 with five pulses in the sub-period T1.

At the transition from n = 48 to n = 49, the now necessary sixth burst is added in the first position, so two "triple" bursts, so to speak, are now present in the first to the third and the fourth to the seventh positions, while no pulses or no burst lies in the fifth position. This condition is shown in the pulse train 50, which contains two pulses in the sub-period T1. At the transition from n = 56 to n = 57, the fourth position of the sub-period T2 is occupied with a burst, too, namely the seventh possible burst, so the whole sub-period T2 is now filled up with pulses or bursts following each other with no space therebetween. This is shown in the pulse trains 62, 63, and 64, with the pulse train 62 containing six, the pulse train 63 seven, and the pulse train 64 eight pulses in the sub-period T1, i.e. in the pulse train 64, the whole period T is filled up with pulses of the duration B.

As can be seen in FIG. 2, only 2N/M switching edges occur in the method according to the invention, i.e. sixteen in the example of FIG. 2. This number is considerably smaller than if the whole period T were filled with individual pulses of the duration B according to the principle of the sub-period T2. In this case, the maximum number of pulse edges would be 2N, i.e. 128. As a result of the small number of switching edges in the method according to the invention, therefore, the temperature dependence mentioned by way of introduction is reduced by a corresponding factor.

Figure 3:
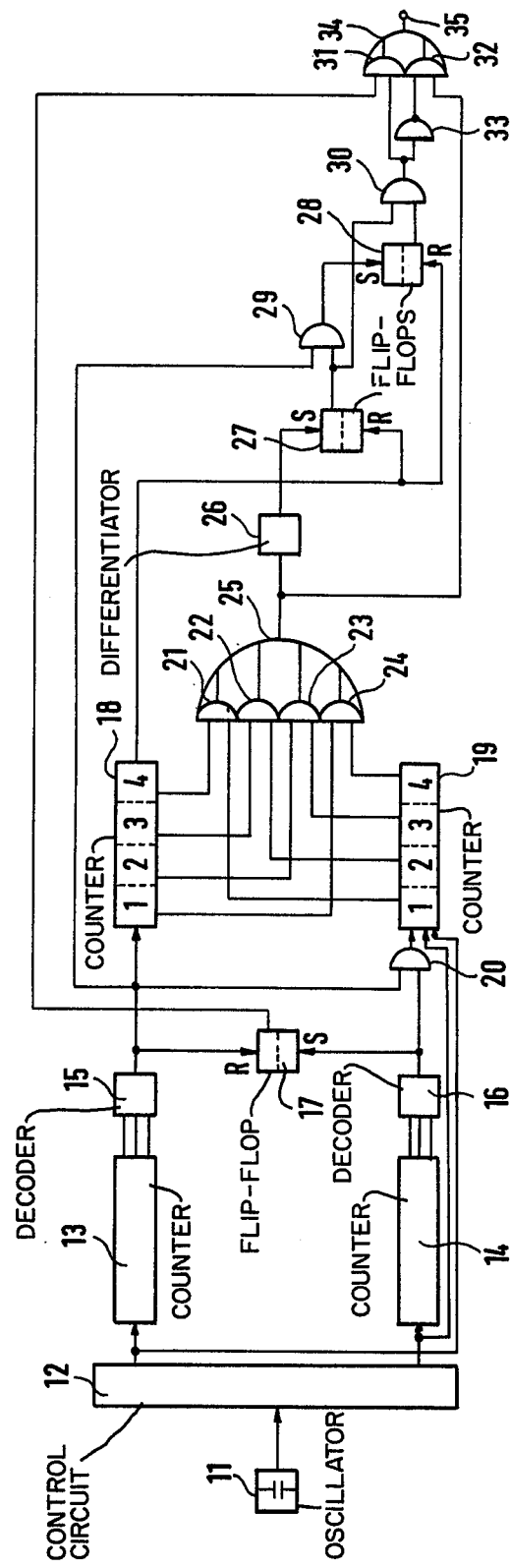
FIG. 3 is a block diagram of a circuit arrangement suitable for carrying out the inventive method.

FIG. 3 shows, as a preferred embodiment, a block diagram of a circuit arrangement for carrying out the method of the invention. Such circuit arrangements for carrying out the method may be constructed, for example, with known TTL circuits because they use digital techniques. Another possibility of implementation is the use of insulated-gate field-effect transistor integrated circuits which are also referred to briefly as MOS integrated circuits. The preferred embodiment of FIG. 3 shows a block diagram of such an MOS integrated circuit. In a design intended for production, this circuit arrangement is realized using the two-phase ratio technique, but it is also possible to employ the other MOS circuit techniques, i.e. the dynamic ratioless two-phase technique or the four-phase technique for example.

In FIG. 3, the output signal of the pulse oscillator 11, whose frequency is $(1/T) \cdot N$, is applied to a control circuit 12. If the aforementioned two-phase technique is employed, the pulse oscillator 11 will be designed as a clock generator generating the two clock signals. The control circuit 12 determines, among other things, the instantaneous number of increments n essentially by allowing n pulses of the output pulses of the pulse generator 11 to pass in each period T to the subsequent circuit elements, which are described below. The signal outputs of the control circuit 12 are coupled to the signal inputs of two cycle counters 13, 14 which are identical in design and each have a count capacity equal to the number M. If realized using MOS technology, the two cycle counters 13, 14 are preferably clocked by the pulse generator 11, and information corresponding to the instantaneous number of increments n constantly circulates in them.

The cycle counters 13 and 14 are allotted decoders 15 and 16, respectively. These two decoders provide a signal when both counters have reached the same count.

For the cycle counters, the various kinds of counting circuits may be used, i.e. binary counters, ring counters, etc. If MOS technology is employed, it will be particularly advantageous to use for the cycle counters 13 and 14 so-called Johnson counters because the circuits for the decoders 15, 16 become especially simple in this case. As is well known, Johnson counters are shift registers employing feed back via an inverter stage, and have a count capacity which corresponds to twice the number of the shift-register stages. The digital information circulating in them consists of a sequence of ones corresponding to the number of said stages, and of a subsequent sequence of zeros corresponding to the number of said stages as well. Thus, if the transition of a Johnson counter from 0 to 1 or from 1 to 0 is decoded, the circuits for the decoders 15, 16 will be particularly simple.

However, the use of Johnson counters will be advisable only if a small count capacity (10 to 20 in the case of 5 to 10 stages) is required. For larger count capacities, therefore, so-called chain counters are more advantageous. They, too, consist of a multistage (number of stages = p) feedback shift register. The outputs of any two stages are coupled to the input via an exclusive-OR gate. The count capacity is $2^p - 1$. With chain counters, the circuits for the decoders 15, 16 are somewhat more complex than with Johnson counters, but the saving in counter stages outweighs the additional expenditure for the decoders, especially at count capacities greater than 40.

Depending on the instantaneous number n of increments, the control circuit 12 changes the information circulating in the cycle counter 14 in such a way that this information is shifted in time with respect to the information circulating in the cycle counter 13 by n increments. This function of the control circuit 12 is more fully described in "McMos Handbook", Motorola Inc., Second Edition 1974, pages 11-2 to 11-5 and in particular FIG. 5 thereof. At the outputs of the decoders 15, 16 therefore, a signal appears which is shifted in time by $n$ increments, too. Since these two output signals are applied to the R input and to the S input of the first R-S flip-flop 17, respectively, the R-S flip-flop's output associated with the R input provides a pulse whose width corresponds to $n$ times the duration B of the pulses of the pulse oscillator 11. This output pulse thus corresponds to the pulses generated in the sub-period T1 of FIGS. 1 and 2.

The output signal of the decoder 15 is also applied to the count input of a count-up binary counter 18. If the above-mentioned MOS technology is used, the output signal of the decoder 15 may also serve as the clock signal for the count-up binary counter 18.

The count input of an up-down counter 19 is fed with the output signal of a first AND-gate 20. If MOS technology is employed, the up-down binary counter 19 is clocked by the same clock signal as the binary counter 18. The outputs of the decoders 15, 16 are each coupled to one input of the first AND-gate 20.

The control circuit 12 switches the up-down binary counter 19 from "up" to "down" depending on whether the instantaneous number $n$ of increments is to be changed toward greater or smaller numbers. This switching possibility is indicated in FIG. 3 by the two additional lines running to the input of the up-down binary counter 19.

In FIG. 3, the two binary counters 18, 19 are shown as four-stage counters for the sake of simplicity; their count capacity, however, is determined by the number K of possible bursts increased by 1. In view of FIG. 2, where $K = 7$, it would thus have been sufficient in FIG. 3 to show the binary counters 18, 19 only as three-stage units, because a three-stage binary counter counts to 8, i.e. $K + 1$.

If MOS technology is employed, it is not necessary to control the two binary counters 18, 19 with the same clock signals as the cycle counters 13, 14. The clock frequency for the binary counters 18, 19 may be lower than that for the cycle counters 13, 14.

The like outputs of the individual stages of the binary counters 18, 19 are interconnected by means of a plurality of AND-gates 21, 22, 23, 24: The output of each stage of the count-up binary counter 18, beginning from the input of this counter, and the output of each stage of the up-down binary counter 19, beginning from the output of this counter, are coupled to one of the AND-gates; thus, stage 1 of the up-down binary counter 19 and stage 4 of the count-up binary counter 18 are coupled to the two inputs of the AND-gate 21; stage 2 of the binary counter 19 and stage 3 of the binary counter 18 are coupled to the inputs of the AND-gate 22; stage 3 of the binary counter 19 and stage 2 of the binary counter 18 are coupled to the inputs of the AND-gate 23, and stage 4 of the binary counter 19 and stage 1 of the binary counter 18 are coupled to the inputs of the AND-gate 24.

The outputs of the AND-gates 21, 22, 23, 24 are coupled to the inputs of an OR-gate 25 whose output is connected to the S input of a second R-S flip-flop 27 via a differentiator 26. The R input of this R-S flip-flop 27 is connected to the output of the count-up binary counter 18. That output of the R-S flip-flop 27 associated with the S input is coupled to one input of a second AND-gate 29 whose second input is connected to the output of the decoder 15. The output of the second AND-gate 29 is coupled to the S input of a third R-S flip-flop 28, whose R input is connected to the output of the count-up binary counter 18.

That output of the third R-S flip-flop 28 associated with the R input is coupled to one input of a third AND-gate 30, whose other input is connected to that output of the second R-S flip-flop 27 associated with the S input.

The output of the third AND-gate 30 is coupled to one input of a fourth AND-gate 31, whose other input is connected to that output of the first R-S flip-flop 17 associated with the R input. The output of the third AND-gate 30 is also coupled via an inverter 33 to one input of a fifth AND-gate 32, whose other input is connected to the output of the OR-gate 25.

The outputs of the fourth and fifth AND-gates 31, 32 are coupled to the input of an OR-gate 34, at whose output 35 the pulse train adjustable in N increments is available.

The method according to the invention and the circuit arrangement for carrying out the same can preferably be used to digitally generate the tuning voltage of the varactor diodes in varactor-tuned radio and television receivers. For this application, the control circuit 12 may be designed so as to change, in the manner of an automatic-signal-seeking circuit, the number $n$ of increments until the set is tuned to a station worth receiving, in which case the automatic frequency control voltage may serve, in the usual way, as the signal stopping the automatic signal seeking operation.

Since it is difficult to realize MOS switching stages from whose outputs large currents can be taken, while, on the other hand, the tuning voltage source in radio and television sets must be loadable with a few milliamperes and, in addition, the choice of the pulse amplitude should not be subject to any limitation, the signal available at the output 35 of the circuit of FIG. 3 will appropriately be applied to a filtering element not directly, but a suitable power stage will be inserted. Particularly advantageously, the temperature-compensated Zener diode commonly used in radio and television receivers is employed for this purpose. By means of a transistor controlled as a switch by the variable pulse train appearing at the output 35, a voltage stabilized by means of the Zener diode is short-circuited pulse by pulse, and the pulse voltage so obtained is filtered in a suitable manner.

The control circuit 12 may also be designed so that the number $n$ of increments, instead of being changed by automatic signal seeking circuitry, is changed by manual operation, e.g. so that, during the time of operation of a contact, the number $n$ of increments becomes greater or smaller, in which case the precise setting to the desired station may serve as the criterion for the end of the contact operation.

If the method in accordance with the invention is used in a color television receiver, it will be advantageous to provide a second chrominance-subcarrier oscillator and to use the signal generated by this oscillator to either synchronize the pulse oscillator or derive from this chrominance-subcarrier signal, by suitable frequency division, a signal corresponding to the pulse oscillator signal.

In a circuit employing two-phase ratio MOS technology for use in television receivers, wherein the number N of increments is 3,968, wherein the period T is about 2 ms and divided into sub-periods T1, T2 with $M = 62$ and $K = 63$, and wherein a voltage stabilized by a temperature-compensated Zener diode is short-circuited pulse by pulse as mentioned above, the hum voltage superimposed on the continuously variable dc voltage was only 0.1 mV after it had been filtered by means of a three-stage RC filtering element. The time constant of the filtering element could be smaller than the period needed on an average for frame synchronization.

Because of the counting capacity of $M = 62$, the cycle counters 13, 14 used in the practical circuit were the abovementioned chain counters, each consisting of five stages (p) and preceded by a binary divider stage.

What is claimed is:

1. A method of generating a train of pulses which is variable in N selectable increments during a period T, which period is divided into two sub-periods T1 and T2, said train of pulses applied to the input of a filtering element to generate a continuously variable dc voltage, comprising:

allotting $n$ ($n = 0, 1, 2 \ldots N$) increments $n$ pulses whose duration B is equal to the period T divided by the number N of increments;

generating $m$ pulses of the $n$ pulses where $m = 0, 1, 2 \ldots M$; ($M < N$) in one sub-period T1 of the period T and the remainder of the $n$ pulses in the other sub-period T2 of the period T such that for $n \leq M$, $m$ pulses are lined up in the sub-period T1 with no space therebetween and for $M < n \leq N$, $k$ bursts ($k = 1, 2 \ldots K$; $K = (N-M)/M$) of M unspaced pulses of the duration B are formed from the $n$ pulses, which bursts are distributed substantially evenly over the sub-period T2 and, for $k > K/2$, follow each other at least partly with no space therebetween, those pulses not forming a full burst are generated as $m$ unspaced pulses in the sub-period T1.

2. A method according to claim 1 wherein the number M of pulses combined in bursts and the number N of increments are chosen to bear an integer relationship to each other.

3. A method according to claim 2 wherein the number M of pulses combined in bursts is substantially as large as the number K of bursts.

4. An apparatus for generating a train of pulses which is variable in N selectable increments during a period T and applied to the input of a filtering element to generate a continuously variable dc voltage, comprising:

a pulse oscillator whose output signal frequency is $(1/T) \cdot N$;

a control circuit for determining the instantaneous number $n$ of increments;

first and second cycle counters having a counting capacity corresponding to a number M, which counters are clocked by said oscillator and whose respective circulating pulse patterns are shiftable in time with respect to each other by said control circuit;

first and second decoders associated with the same counts of said first and second cycle counters;

a first flip-flop having inputs coupled to the outputs of said first and second decoder;

a count-up binary counter having a counting capacity of K + 1 having an input coupled to the output of said first decoder;

an up-down binary counter having a counting capacity of K + 1 having an input coupled to the output of said first decoder and to the output of said second decoder;

a plurality of AND-gates having inputs coupled to like outputs of said count-up binary counter and said up-down binary counter;

a first OR-gate having inputs coupled to the output of said AND-gates;

a differentiator having an input coupled to the output of said first OR-gate;

a second RS flip-flop whose R input is connected to the output of said count-up binary counter and whose S input is connected to the output of said differentiator;

a second AND-gate having a first input coupled to the output of said second RS flip-flop and a second input coupled to the output of said first decoder;

a third RS flip-flop whose R input is connected to the output of said count-up binary counter and whose S input is connected to the output of said second AND-gate;

a third AND-gate having a first input coupled to the output of said third RS flip-flop and whose second input is coupled to the output of said second RS flip-flop;

a fourth AND-gate having a first input coupled to the output of said third AND-gate and a second input coupled to the output of said first RS flip-flop;

a fifth AND-gate having a first input coupled to the output of said first OR-gate and a second input coupled to the output of said third AND-gate; and a second OR-gate having first and second inputs coupled to the outputs of said fourth and fifth AND-gates and at whose output appears said variable pulse train.

* * * * *